United States Patent [19]
Gupta

[11] Patent Number: 5,824,375
[45] Date of Patent: Oct. 20, 1998

[54] DECONTAMINATION OF A PLASMA REACTOR USING A PLASMA AFTER A CHAMBER CLEAN

[75] Inventor: Anand Gupta, San Jose, Calif.

[73] Assignee: Applied Materials, Inc., Santa Clara, Calif.

[21] Appl. No.: 735,904

[22] Filed: Oct. 24, 1996

[51] Int. Cl.$^6$ .................................. H05H 1/24; B08B 6/00
[52] U.S. Cl. ..................... 427/569; 427/534; 427/574; 427/579; 134/1.1; 134/1.2; 156/643.1
[58] Field of Search ..................... 427/569, 585, 427/579, 534, 574; 156/643.1; 134/1.1, 1.2; 216/67

[56] References Cited

U.S. PATENT DOCUMENTS

| | | | |
|---|---|---|---|
| 4,529,474 | 7/1985 | Fujiyama et al. ........................ | 156/643 |
| 4,797,178 | 1/1989 | Bui et al. ................................ | 156/643 |
| 5,158,644 | 10/1992 | Cheung et al. . | |
| 5,221,414 | 6/1993 | Langley et al. ......................... | 156/626 |
| 5,354,715 | 10/1994 | Wang et al. . | |
| 5,362,526 | 11/1994 | Wang et al. ............................. | 427/573 |
| 5,423,945 | 6/1995 | Marks et al. . | |
| 5,454,903 | 10/1995 | Redecker et al. ......................... | 216/67 |
| 5,474,615 | 12/1995 | Ishida et al. ............................. | 134/1.2 |

*Primary Examiner*—Shrive Beck
*Assistant Examiner*—Michael Barr
*Attorney, Agent, or Firm*—Patterson & Streets, L.L.P.

[57] ABSTRACT

A method and apparatus for reducing fluorine and other sorbable contaminants in plasma reactor used in chemical vapor deposition process such as the deposition of silicon oxide layer by the reaction of TEOS and oxygen. According to the method of the present invention, plasma of an inert gas is maintained in plasma reactor following chamber clean to remove sorbable contaminants such as fluorine. The plasma clean is typically followed by seasoning of the reactor to block or retard remaining contaminants. According to one embodiment of the invention, the combination of chamber clean, plasma clean, and season film is conducted before PECVD oxide layer is deposited on wafer positioned in the plasma reactor.

16 Claims, 3 Drawing Sheets

DECONTAMINATION OF A PLASMA REACTOR USING A PLASMA AFTER A CHAMBER CLEAN

FIELD OF THE INVENTION

The present invention relates to the fabrication of integrated circuits. More particularly, the invention provides a cleaning technique for a plasma chamber utilized in the manufacture of integrated circuits.

BACKGROUND OF THE INVENTION

One of the primary steps in the fabrication of modem semiconductor devices is the formation of a thin film on a semiconductor substrate by chemical reaction of gases. Such a deposition process is referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having metal layers previously formed thereon.

Processes which have been developed to deposit insulation films over metal layers at relatively low temperatures include plasma-enhanced CVD (PECVD) techniques such as described in U.S. Pat. No. 5,362,526. Plasma-enhanced CVD techniques promote excitation and/or disassociation of the reactant gases by the application of radio frequency (RF) energy to a reaction zone near the substrate surface, thereby creating a plasma of highly reactive species. The high reactivity of the released species reduces the energy required for a chemical reaction to take place, and thus lowers the required temperature for such PECVD processes. A known PECVD process is the plasma enhanced reaction of tetra-ethylorthosilicate (TEOS) and oxygen ($O_2$).

The surface upon which a CVD layer is deposited may contain sorbable contaminants such as fluorine deposits from chamber cleaning or other processes. The presence of fluorine or other sorbable contaminants may affect the absorption of precursors and slow or inhibit the deposition rate of the CVD layer. Fluorine in the chamber can also form particles when contacted by the reactive gases used to make a PECVD oxide layer.

Particle contamination within the chamber is typically controlled by periodically cleaning the chamber using cleaning gases, typically fluorinated compounds, that are excited to inductively or capacitively coupled plasmas. Cleaning gases are selected based on their ability to bind the precursor gases and the deposition material which has formed on the chamber components in order to form stable volatile products which can be exhausted from the chamber, thereby cleaning the process environment.

Once the chamber has been sufficiently cleaned of the process gases and the cleaning by-products have been exhausted out of the chamber, a season step is performed to deposit a film onto components of the chamber forming the processing region to seal remaining contaminants therein and reduce the contamination level during processing. This step is typically carried out by depositing a season film to coat the interior surfaces forming the processing region in accordance with the subsequent deposition process recipe.

While chamber cleaning and depositing a season film have been successful in reducing most contaminants in a plasma reactor, sorbable contaminants such as fluorine have still been measured above desired levels. Therefore, there exists a need for a method for further reducing sorbable contaminants within a plasma reactor. It is an object of this invention to provide such a method and an integrated apparatus for performing the method.

SUMMARY OF THE INVENTION

The present invention provides a method and apparatus for reducing fluorine and other sorbable contaminants in a plasma reactor used in a chemical vapor deposition process. According to a method of the present invention, a plasma of an inert gas is maintained in a plasma reactor following a chamber clean to remove sorbable contaminants such as fluorine. The plasma clean is typically followed by seasoning of the reactor components with a film to block or retard remaining contaminants. According to one embodiment of the invention, the combination of a chamber clean, a plasma clean, and a season film is conducted before a wafer is positioned in the plasma reactor and a PECVD oxide layer is deposited on the wafer. The plasma reactor is controlled by a computer which is programmed for selection of the chamber clean, the plasma clean, and the season film.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
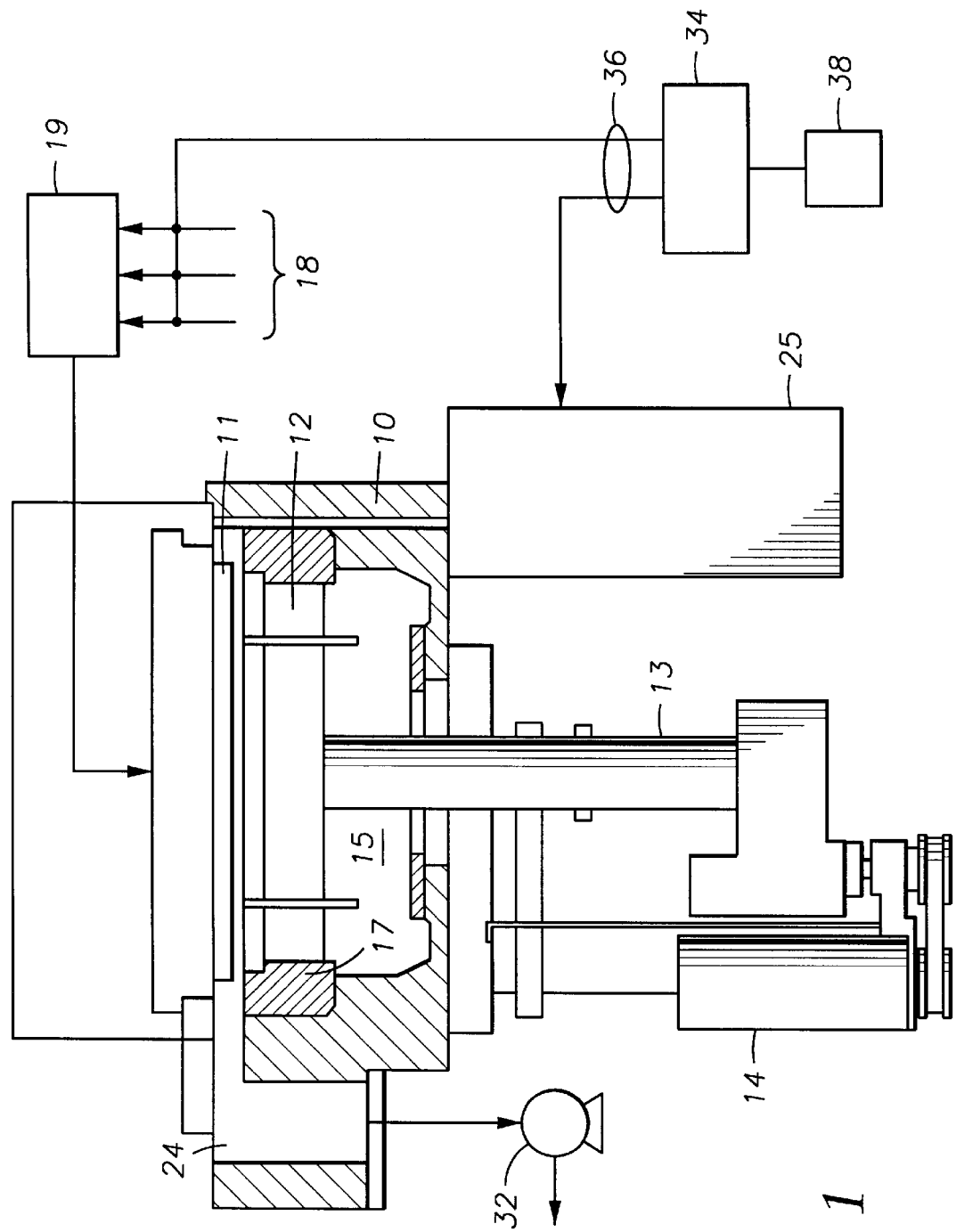
FIG. 1 is a schematic view of an exemplary CVD plasma reactor used according to one embodiment of the present invention.

For a further understanding of the present invention, reference should be made to the ensuing detailed description.

DETAILED DESCRIPTION OF THE INVENTION

The present invention provides a method for reducing fluorine and other sorbable contaminants in a plasma reactor, the method comprising the steps of cleaning the plasma reactor with a plasma comprising a cleaning gas that leaves sorbable contaminants in the plasma reactor and removing the sorbable contaminants from the plasma reactor with a plasma consisting of an inert gas. The method further includes the step of seasoning the plasma reactor with a plasma comprising a reactive gas. These steps will typically be used when a substrate, such as a silicon wafer, is not present in the chamber.

The method of the invention is useful for removing any sorbable contaminant in a plasma reactor such as fluorine and fluorinated compounds produced by cleaning of a plasma reactor with a cleaning gas comprising a fluorine source, such as $NF_3$, $CF_4$, and $C_2F_6$.

In one embodiment, the method reduces the level of particles in a silicon oxide film by sequentially combining the steps of cleaning a plasma reactor with a plasma of a cleaning gas comprising a fluorine source, removing sorbable contaminants from the plasma reactor with a plasma consisting of an inert gas, seasoning the plasma reactor with a plasma comprising a reactive gas such as TEOS, positioning a wafer in the plasma reactor, and depositing a PECVD silicon oxide layer on the wafer.

The plasma of the inert gas preferably consists of helium although a plasma consisting of any gases that are not reactive with contaminants in the plasma reactor should be effective in dislodging and removing sorbable contaminants from the plasma reactor.

A preferred application for the method of this invention is the cleaning of a CVD plasma reactor prior to a PECVD deposition of a silicon oxide layer with a plasma comprising TEOS.

The present invention further provides a substrate processing system, comprising a plasma reactor comprising a reaction zone, a substrate holder for positioning a substrate in the reaction zone, and a vacuum system. The processing system further comprises a gas distribution system connecting the reaction zone of the vacuum chamber to supplies of a cleaning gas and an inert gas, and an RF generator coupled to the gas distribution system for generating a plasma in the reaction zone. The processing system further comprises a controller comprising a computer for controlling the plasma reactor, the gas distribution system, and the RF generator, and a memory coupled to the controller, the memory comprising a computer usable medium comprising a computer readable program code for selecting cleaning of the plasma reactor with a plasma of a cleaning gas that leaves sorbable contaminants in the plasma reactor, and removing sorbable contaminants from the plasma reactor with a plasma consisting of an inert gas.

The processing system may further comprise in one embodiment computer readable program code for seasoning the plasma reactor by depositing a season film on reactor components, positioning a wafer on the substrate holder, and depositing a PECVD silicon oxide layer on the wafer.

Further description of the invention will be directed toward a specific embodiment.

Exemplary CVD Plasma Reactor

One suitable CVD plasma reactor in which a method of the present invention can be carried out is shown in FIG. 1, which is a vertical, cross-section view of a simplified, parallel plate chemical vapor deposition reactor 10 having a vacuum chamber 15. Reactor 10 contains a gas distribution manifold 11 for dispersing process gases through perforated holes in the manifold to a substrate or wafer (not shown) that rests on a substrate support plate or susceptor 12.

Susceptor 12 is resistivity heated and is mounted on a support stem 13 so that susceptor 12 (and the wafer supported on the upper surface of susceptor 12) can be controllably moved by a lift motor 14 between a lower loading/off-loading position and an upper processing position which is closely adjacent to the manifold 11.

When susceptor 12 and the wafer are in the processing position, they are surrounded by an insulator ring 17. During processing, gases inlet to manifold 11 are uniformly distributed radially across the surface of the wafer. The gases exhaust through a port 24 by a vacuum pump system 32 having a throttle valve to control exhaust rate of gas from the chamber.

Before reaching manifold 11, deposition and carrier gases are input through gas lines 18 into a mixing system 19 where they are combined and then sent to manifold 11. Generally, the process gases supply lines 18 for each of the process gases include i) safety shut-off valves (not shown) that can be used to automatically or manually shut off the flow of process gas into the chamber, and ii) mass flow controllers (also not shown) that measure the flow of gas through the gas supply lines. When toxic gases are used in the process, several safety shut-off valves are positioned on each gas supply line in conventional configurations.

The deposition process performed in reactor 10 can be either a thermal process or a plasma enhanced process. In a plasma process, a controlled plasma is formed adjacent to the wafer by RF energy applied to distribution manifold 11 from RF power supply 25 (with susceptor 12 grounded). Gas distribution manifold 11 is also an RF electrode, while susceptor 12 is grounded. RF power supply 25 scan supply either single or mixed frequency RF power to manifold 11 to enhance the decomposition of reactive species introduced into chamber 15. A mixed frequency RF power supply typically supplies power at a high RF frequency (RF1) of 13.56 MHZ and at a low RF frequency (RF2) of 350 KHz.

Heat is provided to the susceptor 12 by a resistive heat coil embedded in the susceptor 12. This additional heat compensates for the natural heat loss pattern of the susceptor and provides rapid and uniform susceptor and wafer heating for effecting deposition.

Typically, any or all of the chamber lining, gas inlet manifold faceplate, support stem 13, and various other reactor hardware is made out of material such as aluminum or aluminum oxide. An example of such a CVD reactor is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al. And assigned to Applied Materials, Inc., the assignee of the present invention.

The lift motor 14, the gas mixing system 19, and the RF power supply 25 are controlled by a system controller 34 over control lines 36. The reactor includes analog assemblies such as mass flow controllers (MFCs), RF generators, and lamp magnet drivers that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum system 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

Figure 2:
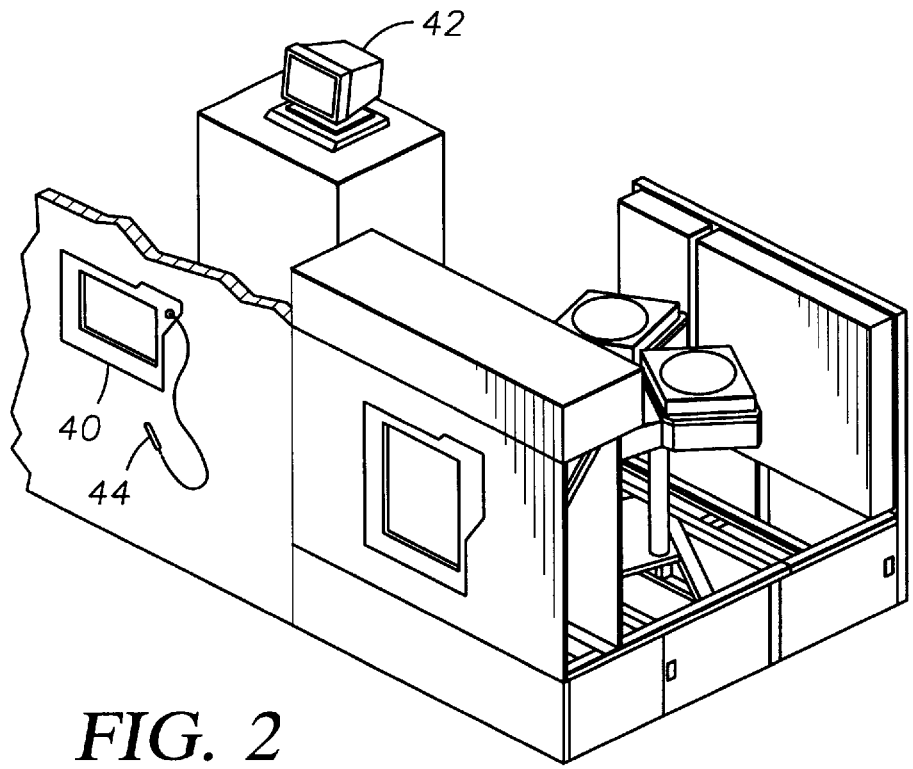
FIG. 2 is a diagram of the system monitor of the CVD plasma reactor of FIG. 1.

The system controller 34 operates under the control of a computer program stored on the hard disk drive 38. The computer program dictates the timing, mixture of gases, RF power levels, susceptor position, and other parameters of a particular process. The interface between a user and the system controller is via a CRT monitor 40 and light pen 44 which are depicted in FIG. 2. In the preferred embodiment a second monitor 42 is used, the first monitor 40 being mounted in the clean room wall for the operators and the other monitor 42 behind the wall for the service technicians. Both monitors 40, 42 simultaneously display the same information but only one light pen 44 is enabled. The light pen 44 detects light emitted by CRT display with a light sensor in the tip of the pen. To select a particular screen or function, the operator touches a designated area of the display screen and pushes the button on the pen 44. The touched area changes its highlighted color, or a new menu or screen is displayed, confirming communication between the light pen and the display screen.

The process can be implemented using a computer program product 410 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of pre-compiled windows library routines. To execute the linked compiled object code, the system user invokes the object code, causing the computer system to load the code in memory, from which the CPU reads and executes the code to perform the tasks identified in the program.

Figure 3:
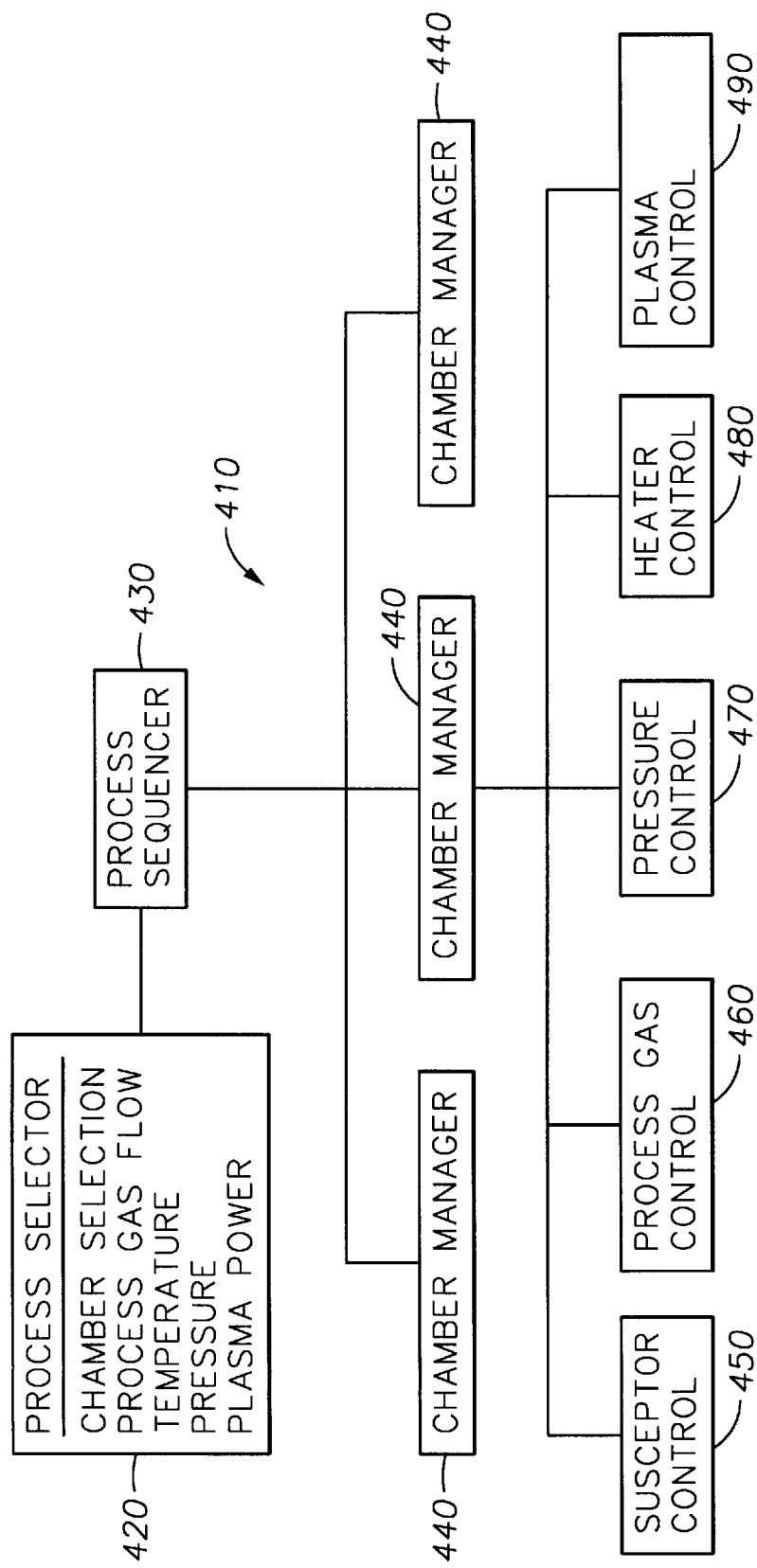
FIG. 3 is a flowchart of a process control computer program product used in conjunction with the exemplary CVD plasma reactor of FIG. 1.

FIG. 3 shows an illustrative block diagram of the hierarchical control structure of the computer program 410. A user enters a process set number and process chamber number into a process selector subroutine 420 in response to menus or screens displayed on the CRT monitor 40 by using the light pen 44 interface. The process sets are predetermined sets of process parameters necessary to carry out specified processes, and are identified by predefined set numbers. The process selector subroutine 420 identifies (I) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes a program code to perform the steps of (I) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber 15 according to the process set determined by the sequencer subroutine 430. For example, the chamber manager subroutine 440 comprises program code for controlling sputtering and CVD process operations in the process chamber 15. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the process chamber 15.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber 15 and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber components subroutines will now be described with reference to FIG. 3. The susceptor control positioning subroutine 450 comprises program code for controlling chamber components that are used to load the substrate onto the susceptor 12, and optionally to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 450 controls movement of the susceptor 12 in response to process set parameters t that are transferred from the chamber manager subroutine 440.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 1460 operates by opening the gas supply lines, and repeatedly (I) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as argon is flowed into the chamber 15 to stabilize the pressure in the chamber before reactive process gases are introduced into the chamber. For these processes, the process gas control subroutine 460 is programmed to include steps for flowing the inert gas into the chamber 15 for an amount of time necessary to stabilize the pressure in the chamber, and then the steps described above would be carried out. Additionally, when a process gas it to be vaporized from a liquid precursor, for example tetraethylorthosilicate (TEOS), the process gas control subroutine 460 would be written to include steps for vaporizing the liquid precursor in a delivery gas such as helium. For this type of process, the process gas control subroutine 460 regulates the flow of the delivery gas and the liquid precurser. As discussed above, the desired process gas flow rates are transferred to the process gas control subroutine 1460 as process parameters. Furthermore, the process gas control subroutine 1460 includes steps for obtaining the necessary delivery gas flow rate and liquid precurser flowrate by accessing a stored table containing the necessary values for a given process gas flow rate. Once the necessary values are obtained, the delivery gas flow rate and the precurser liquid flowrate are monitored, compared to the necessary values, and adjusted accordingly.

The pressure control subroutine 470 comprises program code for controlling the pressure in the chamber 15 by regulating the size of the opening of the throttle valve in the exhaust system 32 of the chamber. The size of the opening of the throttle valve is set to control the chamber pressure to the desired level in relation to the total process gas flow, size of the process chamber, and pumping set point pressure for the exhaust system 32. When the pressure control subroutine 470 is invoked, the desired, or target pressure level is received as a parameter from the chamber manager subroutine 440. The pressure control subroutine 470 operates to measure the pressure in the chamber 15 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the chamber 15 to the desired pressure.

The heater control subroutine 480 comprises program code for controlling the temperature of the resistive heat coil that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat coil in the susceptor 12 to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the resistive heat module 26. The gradual ramp up/down increases the life and reliability of the heat coil in the susceptor 12. Additionally, a built-in-fail-safe mode can be included to detect process safety compliance, and can shut down operation of the heat coil if the process chamber 15 is not properly set up.

The plasma control subroutine 490 comprises program code for setting the RF bias voltage power level applied to the process electrodes in the chamber 15, and optionally, to set the level of the magnetic field generated in the chamber. Similar to the previously described chamber component subroutines, the plasma control subroutine 490 is invoked by the chamber manager subroutine 440.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the wafer could be heated by a UV lamp module. The pretreatment and method for forming a pretreated layer of the present invention is not limited to any specific apparatus or to any specific plasma excitation method.

Pretreatment for the Deposition of a CVD Layer

The present cleaning process may be employed to reduce particle contamination during deposition of a CVD layer such as a PECVD silicon oxide layer formed on a wafer in a substrate processing chamber such as chamber 15 in the exemplary CVD plasma reactor 10 described above.

Figure 4:
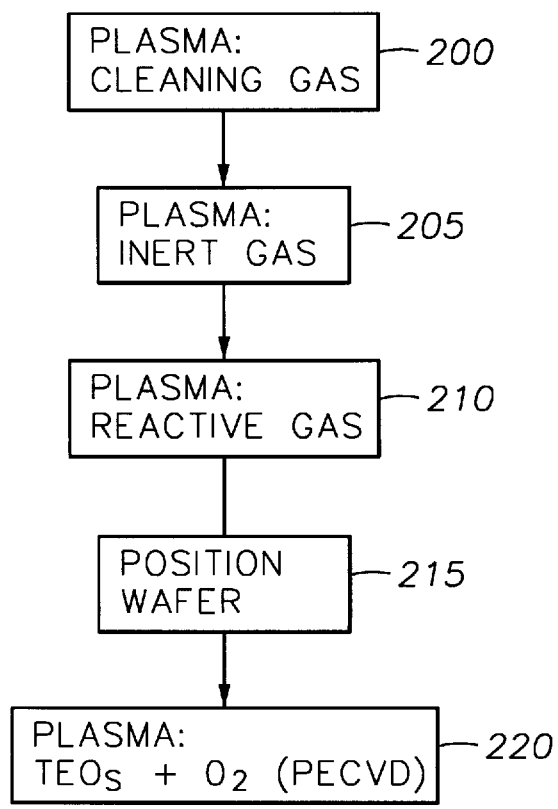
FIG. 4 is a flow chart illustrating steps undertaken in pretreating the plasma reactor and depositing a two-layer silicon oxide film according to one embodiment of the present invention.

FIG. 4 illustrates a preferred process of the invention for reducing particles in a PECVD silicon oxide layer. This process is implemented and controlled using a computer program stored in the memory 38 of a computer controller 34 for a CVD reactor 10.

Referring to FIG. 4, a clean process 200 is performed in the plasma reactor 10 by introducing cleaning gases, such as $NF_3$, $CF_4$, $C_2F_6$, or any other cleaning gases used in the industry, and striking a plasma, preferably including both an inductively and a capacitively coupled plasma, in the process chamber 15 according to methods known in the art. The gaseous reaction products formed between the cleaning gases and the deposition material and contaminants present within the chamber are exhausted out of the chamber. After both the inductive and capacitive clean processes have been performed in the chamber, a desorption process 205 is performed by introducing an inert gas, such as helium or a mixture of helium and argon, and striking a plasma in the chamber 15 by methods known in the art. The plasma consists of the inert the gas to avoid reactions that form additional contaminants. The plasma of the inert gas removes sorbed contaminants although the mechanism is not known. The chamber is then seasoned 210 by introducing a reactive gas such as TEOS and oxygen and striking a plasma in the chamber 15 according to methods known in the art. The plasma deposits a season layer of silicon oxide onto the chamber components exposed to the, process environment.

The season step 210 will typically be carried out according to the same process gas recipe to be used to subsequently deposit a PECVD layer on the substrate, but typically at a lower bias RF power to form a coating layer of the deposition material on the chamber components, while subjecting the chamber components adjacent the processing region to conditions approaching the processing environment. The season step conditions may be manipulated to further reduce contaminant levels by subjecting the chamber components to higher process temperatures.

Following pretreatment of the plasma reactor 10, a wafer is positioned 215 in the CVD plasma reactor 10 a PECVD layer is deposited 220 on the wafer. The wafer may be positioned by loading the wafer into vacuum chamber 15 through a vacuum-lock door, placing the wafer onto susceptor 12, and moving the wafer into processing position 14. In one specific embodiment, processing positioning 14 is located 250–500 mils from the gas distribution manifold 11. Chamber 15 is heated to a temperature of between 300–500° C., and preferably is maintained at a temperature of approximately 400° C. throughout the deposition of the PECVD layer.

The PECVD layer is preferably deposited with a process gas that includes a mixture of TEOS and oxygen which are introduced into chamber 15 via gas lines 18 and mixing system 19. Addition of nitrogen to the process gas may further block the passage of contaminants through the PECVD layer. The liquid TEOS is vaporized and mixed with an inert carrier gas, such as helium, and is flowed at a net rate of about 400–1500 sccm and preferably at a net flow rate of about 800 sccm.

These flow rates are given for a chamber having a volume of approximately 5.5 to 6.5 liters. The $O_2$ is flowed into the chamber 15 at a rate of about 400–1500 sccm and preferably at a rate of approximately 600 sccm. Chamber 15 is brought to a pressure of about 1–20 torr. Preferably, chamber 15 is maintained at a pressure of about 2–5 torr during deposition of the PECVD layer.

A plasma is formed from the PECVD process gas by the application of mixed frequency RF power from RF power supply 25, resulting in the deposition of the PECVD layer (step 220). An inert gas, such as helium, may be used to stabilize the plasma.

The invention is further described by the following example of a pretreatment method which can be used prior to depositing a CVD layer. The pretreatment includes a plasma consisting of an inert gas prior to a season layer.

EXAMPLE

The following example demonstrates the present invention by describing a successful pretreatment of a CVD plasma reactor. This example was undertaken using a chemical vapor deposition chamber, and in particular, a "CENTURA DxZ" plasma reactor fabricated and sold by Applied Materials, Inc., Santa Clara, Calif.

The chamber was stabilized for 5.0 seconds at a pressure of 4.4 Torr with an oxygen flow of 550 sccm, a hexafluoroethylene ($C_2F_6$) flow of 400 sccm, and a nitrogen trifluoride ($NF_3$) flow of 60 sccm prior to raising of the susceptor and prior to application of RF power. The chamber was then cleaned for 55.0 seconds by applying 1950 W of RF power (13.56 MHZ) to the gas distribution plate while the grounded susceptor remained in the fully lowered position. The susceptor was then raised to 280 mil separation from the gas distribution plate and the contaminants where cleaned from the chamber for 30.0 seconds with a helium plasma at a pressure of 3.0 Torr after shutting off all gas flows and opening the flow of helium to 1500 sccm and applying 350 W of RF power (13.56 MHZ). The helium flow was then closed and the RF power removed for a period of 5.0 seconds.

The cleaning of contaminants in the CVD reactor with a plasma of helium after a conventional chamber clean has reduced particle formation by 50% or more in comparison to the same cleaning process without the plasma of helium.

While the foregoing is directed to the preferred embodiment of the present invention, other and further embodiments of the invention may be devised without departing from the basic scope thereof, and the scope thereof is determined by the claims which follow.

I claim:

1. A method for reducing sorbable contaminants in a reactor, comprising the steps of:
   cleaning a reactor with a plasma comprising a cleaning gas that leaves sorbable contaminants in the reactor; and
   removing sorbable contaminants from the reactor with a plasma consisting of an inert gas.

2. The method of claim 1, wherein the cleaning gas comprises a fluorine source.

3. The method of claim 2, wherein the cleaning gas is selected from a group consisting of $NF_3$, $CF_4$, and $C_2F_6$.

4. The method of claim 1, wherein the inert gas consists of helium.

5. The method of claim 1, further comprising the step of depositing a season film on reactor components.

6. The method of claim 5, wherein the season film is deposited from a reactive gas comprising TEOS, oxygen, and helium.

7. The method of claim 5, further comprising the steps of positioning a wafer in the reactor and depositing a silicon oxide layer on the wafer.

8. A method for reducing sorbable contaminants in a reactor, comprising the steps of:
   cleaning a reactor with a plasma of a cleaning gas comprising a fluorine source that leaves sorbable contaminants;
   cleaning the reactor by removing the sorbable contaminants, with a plasma consisting of helium; and
   seasoning the reactor by depositing a season film on reactor components.

9. The method of claim 8, wherein the cleaning gas is selected from a group consisting of $NF_3$, $CF_4$, and $C_2F_6$.

10. The method of claim 8, wherein the season film is deposited from a reactive gas comprising TEOS, oxygen, and helium.

11. The method of claim 8, further comprising the steps of positioning a wafer in the reactor and depositing a silicon oxide layer on the wafer.

12. A method for reducing particles in a silicon oxide layer, comprising the steps of:
   introducing a cleaning gas comprising a fluorine source into a reactor;
   generating a plasma of the cleaning gas within the reactor, which leaves particles within the reactor;
   introducing an inert gas into the reactor; and
   generating a plasma consisting of the inert gas within the reactor, which removes the particles from the reactor.

13. The method of claim 12, wherein the fluorine source is selected from a group consisting of $NF_3$, $CF_4$, and $C_2F_6$.

14. The method of claim 12, wherein the inert gas consists of helium.

15. The method of claim 12, further comprising the steps of:
   seasoning the reactor by depositing a season film on reactor components;
   positioning a wafer in the reactor; and
   depositing a silicon oxide layer on the wafer;
   wherein the season film is deposited from a reactive gas comprising TEOS, oxygen, and helium.

16. The method of claim 12, wherein the silicon oxide layer is deposited from a reactive gas comprising TEOS, oxygen, and helium.

* * * * *

UNITED STATES PATENT AND TRADEMARK OFFICE
CERTIFICATE OF CORRECTION

PATENT NO. : 5,824,375
DATED : October 20, 1998
INVENTOR(S) : Anand Gupta

It is certified that error appears in the above-identified patent and that said Letters Patent is hereby corrected as shown below:

In column 8, line 57, after "the" please delete ",".

Signed and Sealed this

Seventeenth Day of August, 1999

Attest:

Q. TODD DICKINSON

*Attesting Officer*   *Acting Commissioner of Patents and Trademarks*